(12) United States Patent
Lim et al.

(10) Patent No.: US 7,666,011 B2
(45) Date of Patent: Feb. 23, 2010

(54) ELECTRICAL CONNECTOR SOCKET WITH LATCH MECHANISM

(75) Inventors: Poh Teck Lim, Floravale (SG); Siow Pheng Goh, Singapore (SG); Han Young Soh, Singapore (SG)

(73) Assignee: Molex Incorporated, Lisle, IL (US)

( * ) Notice: Subject to any disclaimer, the term of this patent is extended or adjusted under 35 U.S.C. 154(b) by 16 days.

(21) Appl. No.: 11/792,358

(22) PCT Filed: Nov. 30, 2005

(86) PCT No.: PCT/US2005/043203

§ 371 (c)(1),
(2), (4) Date: Mar. 19, 2008

(87) PCT Pub. No.: WO2006/062773

PCT Pub. Date: Jun. 15, 2006

(65) Prior Publication Data

US 2009/0017666 A1    Jan. 15, 2009

(30) Foreign Application Priority Data

Dec. 9, 2004   (SG)   ............................. 200407280-7

(51) Int. Cl.
  *H01R 13/62* (2006.01)
(52) U.S. Cl. ...................................... 439/157; 439/328
(58) Field of Classification Search ................ 439/157, 439/159, 160, 325, 326, 327, 328, 637
See application file for complete search history.

(56) References Cited

U.S. PATENT DOCUMENTS

| 3,216,580 | A | * | 11/1965 | Fricker, Jr. ................ 211/41.17 |
| 3,573,706 | A | | 4/1971 | Haberlen |
| 4,349,237 | A | | 9/1982 | Cobaugh et al. |
| 4,487,468 | A | | 12/1984 | Fedder et al. |
| 5,096,435 | A | * | 3/1992 | Noschese et al. ............ 439/260 |
| 5,308,249 | A | * | 5/1994 | Renn et al. .................... 439/62 |
| 5,443,394 | A | * | 8/1995 | Billman et al. .............. 439/157 |
| 5,445,531 | A | * | 8/1995 | Billman et al. .............. 439/160 |
| 5,730,611 | A | | 3/1998 | Cheng et al. |
| 5,846,095 | A | | 12/1998 | Bowen |
| 6,200,149 | B1 | | 3/2001 | Chi-Chung |
| 6,939,157 | B2 | * | 9/2005 | Chiu .......................... 439/328 |
| 6,948,957 | B1 | * | 9/2005 | Costello et al. ............. 439/157 |

* cited by examiner

*Primary Examiner*—Thanh-Tam T Le
(74) *Attorney, Agent, or Firm*—Stephen L. Sheldon

(57) ABSTRACT

An electrical connector for receiving a daughter card having a plurality of conductive surfaces is described. The electrical connector has a socket with an elongated slot for receiving the daughter card. The slot has electrical terminals for engaging the plurality of conductive surfaces on the daughter card and for electrically connecting the daughter card to the connector. A latch at each end of the elongated slot secures the daughter card to the connector. The latch includes a pair of inwardly directed opposing securing hooks and a pair of unlocking members.

13 Claims, 8 Drawing Sheets

ELECTRICAL CONNECTOR SOCKET WITH LATCH MECHANISM

FIELD OF THE INVENTION

The present invention relates to electrical connectors, particularly to electrical connectors for printed circuit boards, and has application to printed circuit board connectors, which provide a retentive force using a latch mechanism.

BACKGROUND OF THE INVENTION

The invention has application to the electrical interconnection of modules, such as Single In-line Memory Modules Memory Modules (SIMM) to a motherboard. The sockets used for interconnecting are typically formed to include an elongated slot and a plurality of electrical terminals coupled to the socket housing. When a daughter card is inserted into the slot the terminals engage conductive surfaces on the daughter card so that the daughter card and motherboard are electrically connected. In order to prevent the daughter card from dislodging from the socket it is known to provide a retention mechanism.

U.S. Pat. No. 3,573,706 to Haberlen describes a connector having an H-shaped detent spring daughter card retaining device at each end of an elongated slot. The retaining device has two pairs of legs. Each air of legs has retaining hooks, one pair of the retaining hooks retains the spring to the motherboard. The daughter card is slotted into the elongated slot and the two hooks of the other pair of legs engage in a hole or notch in the daughter card. To disengage the card from the connector the hooks retaining the spring to the motherboard are disengaged requiring access below the motherboard. Further the hooks and legs retaining the daughter card to the connector are exposed and may inadvertently be knocked thus allowing the daughter card to disengage from the socket.

U.S. Pat. No. 3,932,016 to Ammenheuser describes a connector having a pair of opposed slotted card retainers. Each retainer includes a channel aligned with the elongated slot of the connector so that the daughter card is slotted into the channel and the elongated slot. A locking tab in each channel retains the daughter card by catching a notch of the card. To remove the daughter card the locking tab is flexed to release the tab from the notch allowing easy removal of the daughter card.

U.S. Pat. No. 5,364,282 to Tondreault describes a connector socket 3 seen in FIGS. 1 and 3 having a cam type retaining and ejector mechanism 5. The rotatable mechanism 5 includes a locking head to engage a notch 7 in a daughter card 2. Because it is exposed the rotatable mechanism may inadvertently be knocked thus disengaging the daughter card from the socket. Further the rotatable feature requires more space than the socket would otherwise need.

U.S. Pat. No. 6,017,246 to Hisazumi et al describes a connector in which the daughter card is retained by the force of the terminals acting on the daughter card.

U.S. Pat. No. 6,045,386 to Boe describes a separate frame for securing a daughter card to a connector. The frame surrounds the socket and includes engaging members movable to secure a daughter card in the connector. The engaging members because they are exposed are easily knocked and because of the use of a separate frame increases the overall amount of space required.

U.S. Pat. No. 6,126,471 to Yu et al teaches the use of a retention mechanism having detachable locking mechanisms.

SUMMARY OF THE INVENTION

An object of at least one embodiment of the invention is to provide a circuit board connector with a retention device that minimizes the space required for the connector.

Another object of at least one embodiment of the invention is to provide a connector with a retention device with separate retaining and disengaging features.

In a first aspect the invention may be said to consist in an electrical connector for receiving a daughter card having a plurality of conductive surfaces, said electrical connector having a socket with an elongated slot for receiving said daughter card said slot having electrical terminals for engaging said plurality of conductive surfaces on said daughter card and for electrically connecting said daughter card to said connector; and a latch at each end of said elongated slot for securing said daughter card to said connector, each said latch including a pair of inwardly directed opposing securing hooks and a pair of unlocking members.

The securing hooks preferably overlap in a first securing position.

Pushing apart said unlocking members preferably moves said securing hooks from a first securing position to a second position, said second position not providing a securing force.

The latch is preferably protected from accidental release by a protective surround and preferably the protective surround and said socket are molded in one piece.

Each said latch preferably comprises a mirrored pair of U shaped springs, each said spring having first and second coplanar legs, said second leg including an inwardly directed beveled securing hook and an inwardly beveled unlocking member.

Preferably each spring is made of metal.

Optionally each spring is made of plastic.

The ends of said daughter card preferably include at least one notch and said pair of inwardly directed opposing securing hooks engage said notch to secure said daughter card within said socket.

The invention may further be said to consist in any alternative combination of parts or features mentioned herein or shown in the accompanying drawings. Known equivalents of these parts or features which are not expressly set out are nevertheless deemed to be included.

BRIEF DESCRIPTION OF THE DRAWINGS

Disclosed embodiments and methods of utilizing the invention will be further described, with reference to the accompanying FIGS., by way of example only and without intending to be limiting, wherein.

DETAILED DESCRIPTION OF THE DISCLOSED EMBODIMENTS

Referring to the Figures it will be appreciated that the invention may be implemented in various forms and modes. The following description of the disclosed embodiment of the invention is given by way of example only.

Figure 1:
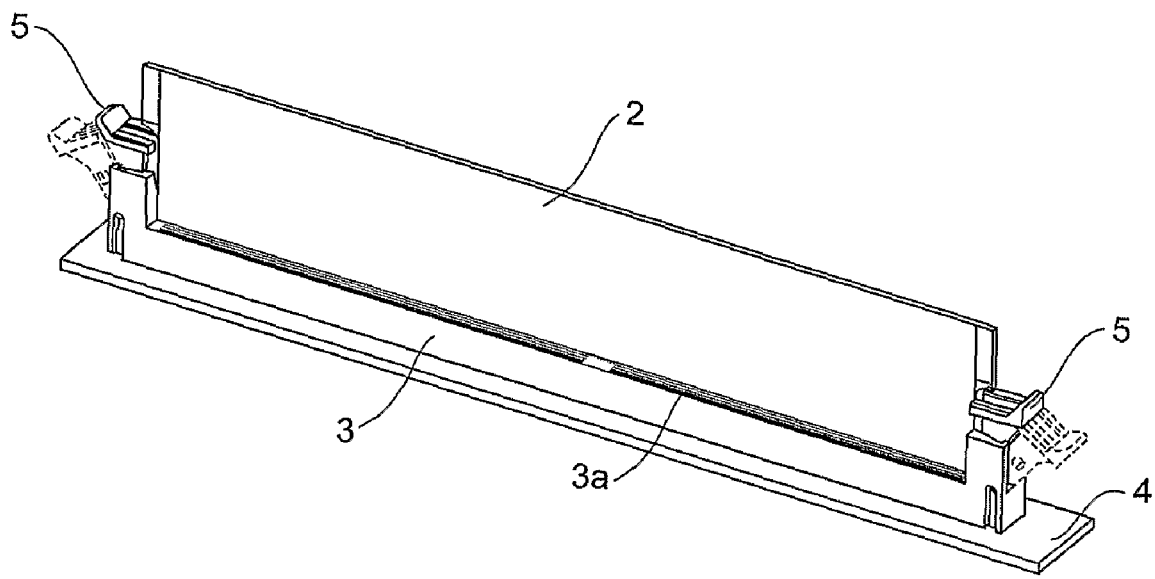
FIG. 1 shows a prior art connector with a pivotably coupled retention device.
Figure 2:
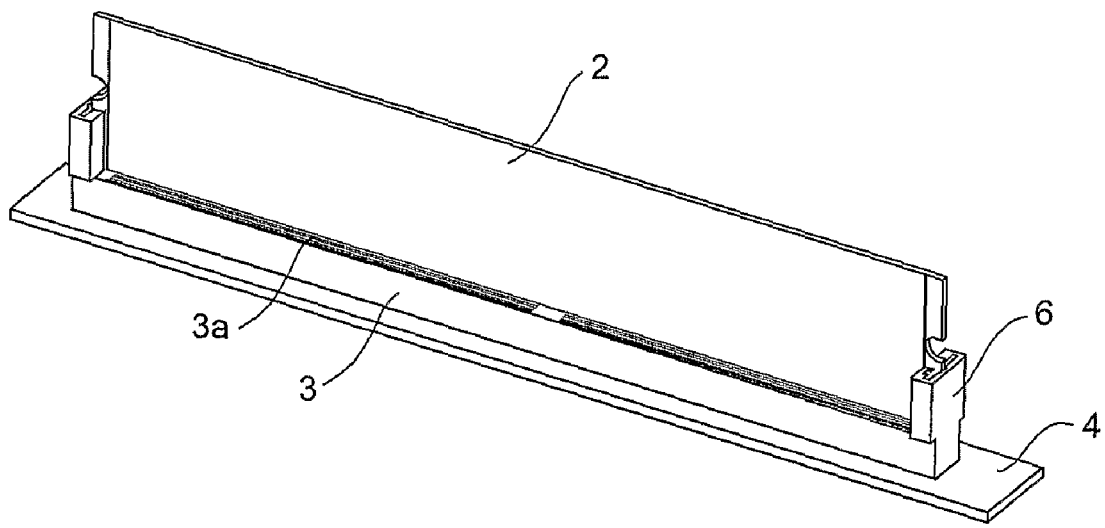
FIG. 2 is a perspective view of the connector of the present invention.

Referring to the drawings FIG. 2 illustrates the connector of the present invention. The connector or socket includes a housing 3 including an elongated slot 3a to receive a daughter card 2. A plurality of electrical terminals 3b are embedded in the housing for electrically connecting the daughter card 2 to another board 4. At each lateral end of the housing 3 is a tower 6 for supporting and retaining the daughter card 2 within the socket 3.

Figure 3:
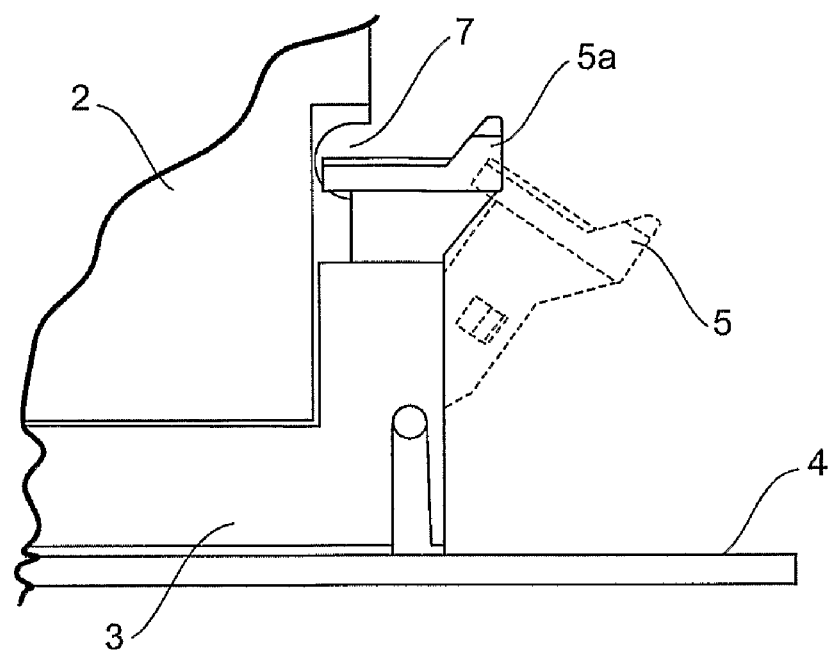
FIG. 3 is a partial side elevation of pivotably coupled retention device and connector shown in FIG. 1.
Figure 4:
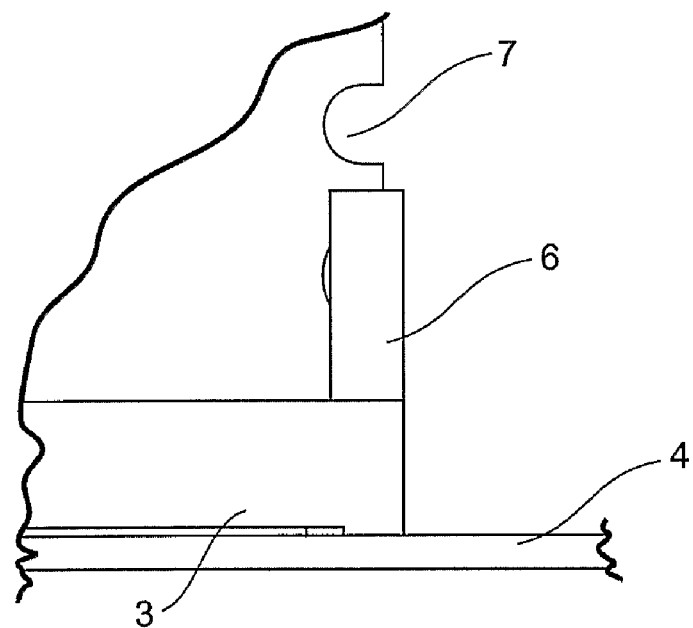
FIG. 4 is a partial side elevation of the connector and retention device of the present invention shown in FIG. 2.

Each tower seen in FIG. 4 includes a securing mechanism for retaining a daughter card 2 via a notch 7 in the daughter card. As can be see when comparing FIGS. 3 and 4 the integrated retaining mechanism of the present invention seen in FIG. 4 allows the length of the connector to be reduced when used with the same daughter card 2 module compared to the prior art socket seen in FIG. 3.

Figure 5:
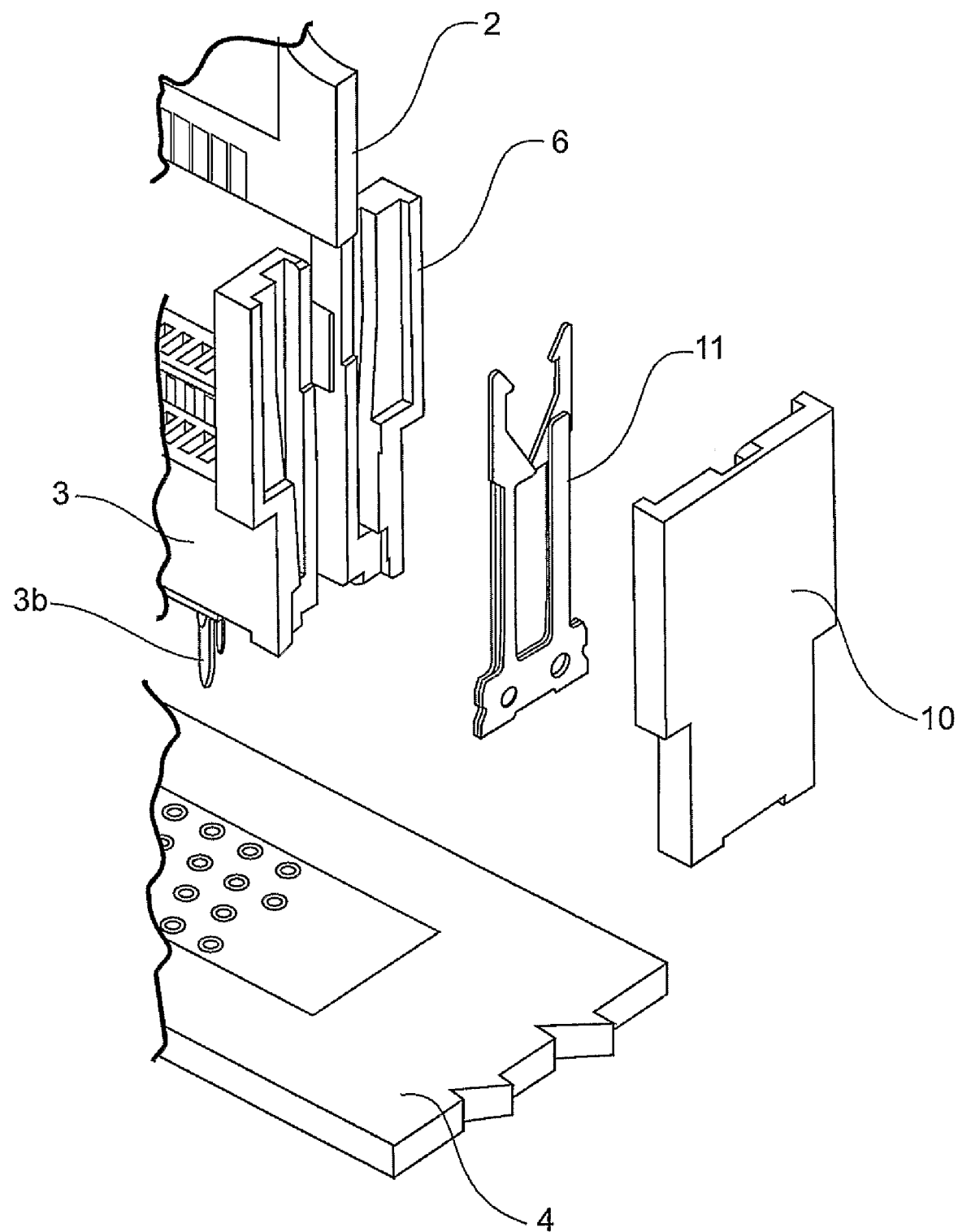
FIG. 5 is an exploded partial perspective view of the connector and retention device of the present invention.

Referring to FIG. 5 the integrated retaining mechanism includes a latch 11 with a locking mechanism. As seen in FIG. 5 the tower may include a cover 10 to protect the latch and thus prevent the daughter card from being accidentally released by the locking mechanism. The cover 10 is shown as a separate part the towers and housing including the protective end covers are in the preferred embodiment molded as one piece. Alternatively the cover 10 may be molded separately and assembled.

Figure 6:
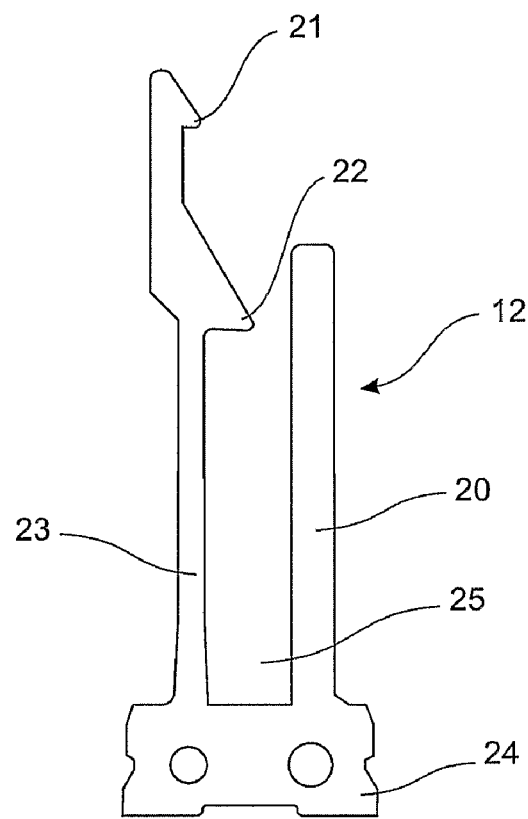
FIG. 6 is a front view of a single detent spring.

The latch is formed from two U shaped detent springs 12. Referring to FIG. 6 each spring has a base 24 and two coplanar legs 20, 23. The first leg 20 is straight and provides lateral support to the daughter card 2. The second leg 23 includes an inwardly directed beveled locking hook 22 and at the distal end of the leg 23 an inwardly beveled unlocking feature 21. In the preferred embodiment the springs are made of metal but may be made from any suitable material such as plastic.

Figure 7:
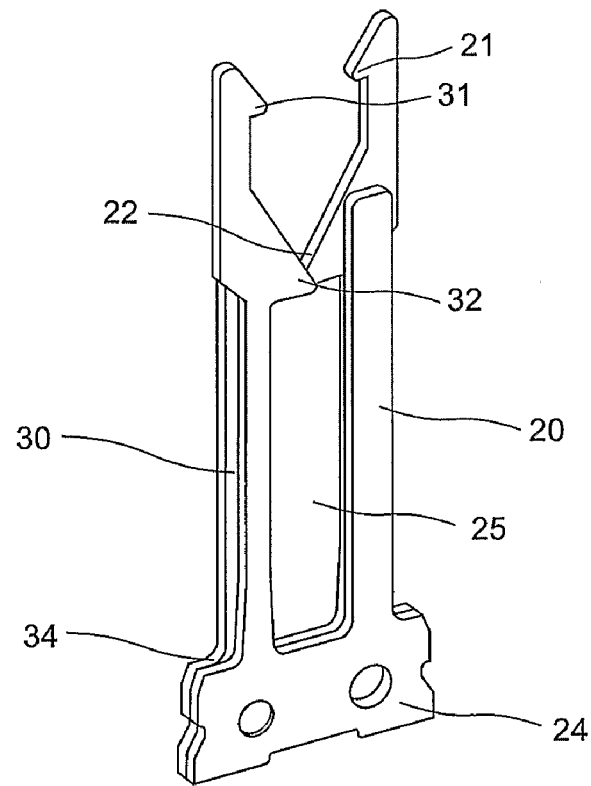
FIG. 7 is perspective view of a pair of detent springs.

A pair of springs seen in FIG. 7 is used in each tower 6 with one of the springs being the mirror image of the other so as to have the two securing hooks 22, 32 opposite each other in a scissor like manner. Additionally the use of two parallel springs allows the latching mechanism to provide lateral support to the daughter card 2. The lateral support is provided by the two first legs 30, 20 and the space between the two legs defines a slot 25 into which in use the ends of the daughter card 2 fits. The notch 7 in the daughter card 2 is engaged by the locking hooks 22, 32 to secure the daughter card 2 within the connector 3.

Figure 8:
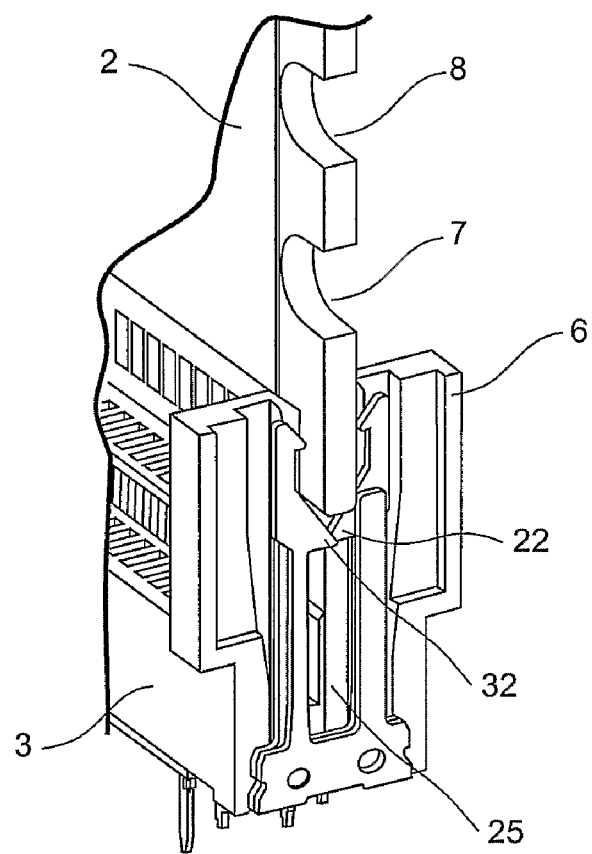
FIG. 8 is partial perspective view of the connector and retention device of the present invention with the protection cover removed showing a daughter card partially inserted.

FIG. 8 shows an end view of a connector 3 showing a tower 6 with a cover 10 removed. A partially inserted daughter card 2, which has two securing notches 7 and 8 is pushing on the beveled edges of the securing hooks 22, 23 pushing the hooks 22, 23 apart allowing the end of the daughter card to enter the slot 25 between the opposing first legs. The slot between the opposing first legs is aligned with the slot 3a in the connector housing 3 and a slot in the tower 6. The alignment of the slots 3a, 25 allows for the daughter card 2 to be properly inserted and secured.

Figure 9:
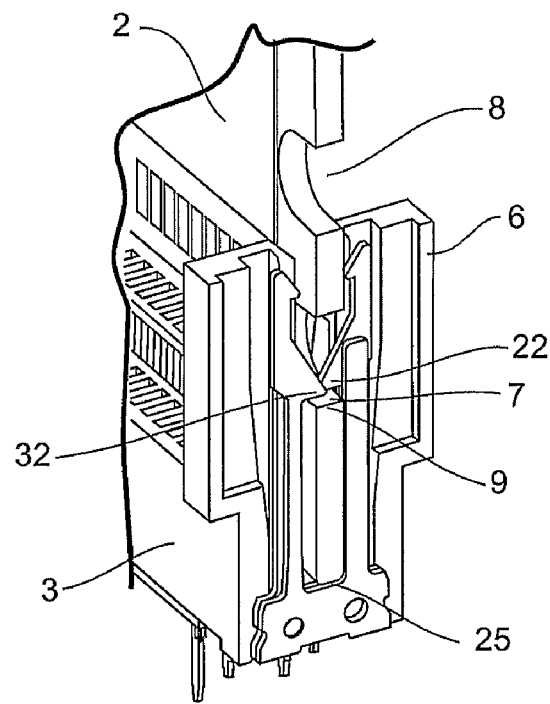
FIG. 9 is partial perspective view of the connector and retention device of the present invention with the protective end cover removed showing a daughter card fully inserted.

As is seen in FIG. 9 once the daughter card 2 is fully inserted the opposing hooks 22, 32 engage a notch 7 in the daughter card 2 thus securing the daughter card within the connector.

Figure 10:
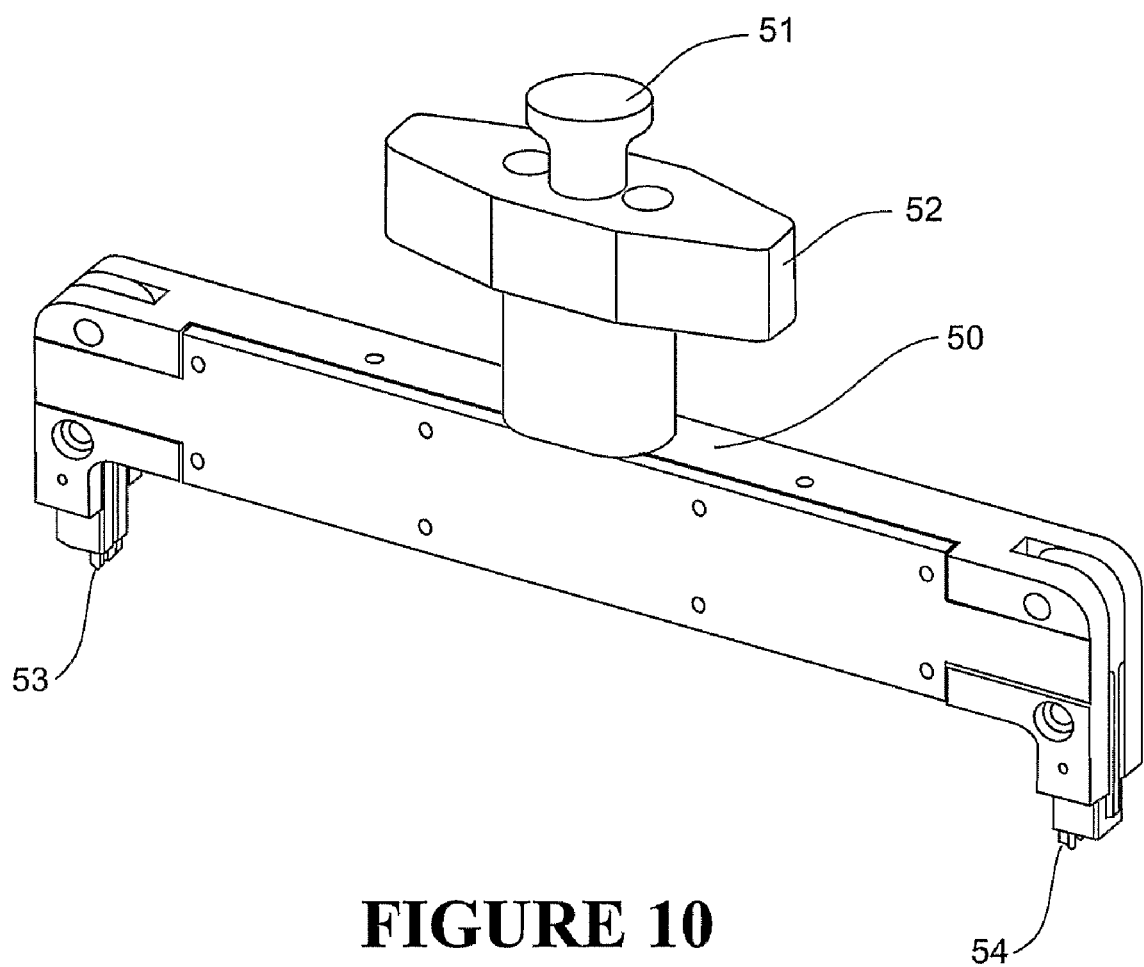
FIG. 10 is perspective view of a tool for the insertion and removal of daughter cards.

To remove the daughter card 2 a removal tool 50 seen is FIG. 10 is needed to disengage the hooks from the notch 7. The removal tool 50 includes disengaging heads 53, 54 that in use lines up with the unlocking features 21, 31. A button 51 on the handle 52 of the tool 50 is used to move the disengaging heads 53, 54.

Figure 11B:
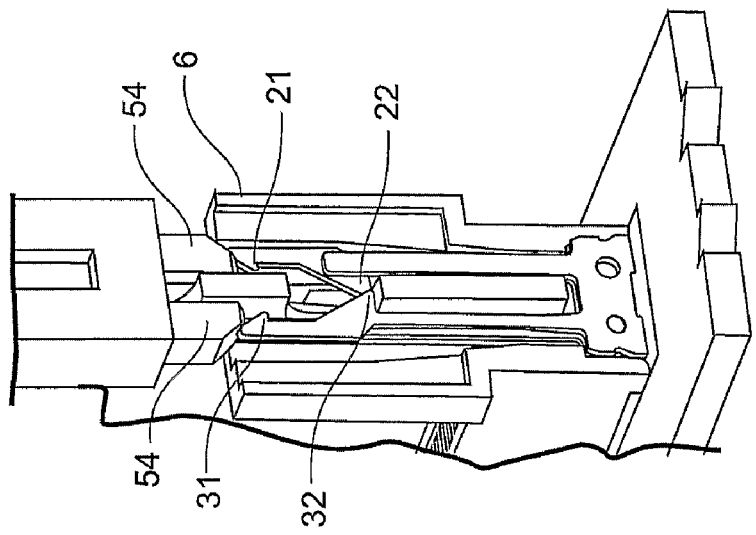
FIGS. 11A and 11B, are partial perspective views showing the use of the tool illustrated in FIG. 10 with the connector and retention device of the present invention.
Figure 11A:
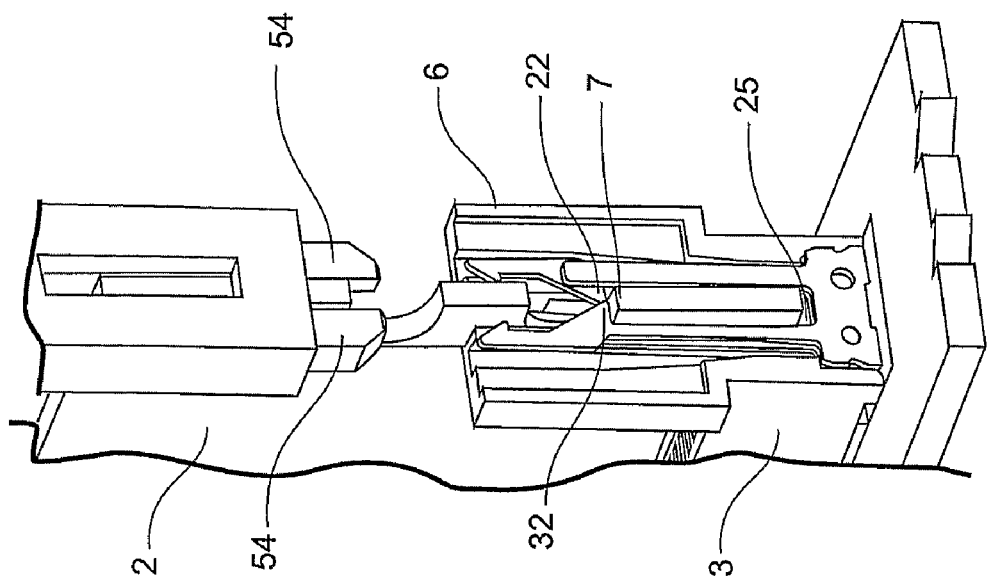

The process of removing a daughter card can be seen in FIGS. 11A to 11B, referring to FIG. 11A the daughter card 2 is engaged in the connector, the opposing hooks 22, 32 have engaged the notch 7. The removal tools disengaging head 54 is shown aligning with the latch. The other removal tools disengaging head 53 would at the same time be aligning with the latch on the opposite tower 6 to the tower illustrated. All actions would be performed on both latches at once by the tool 50. Each disengaging head 54 is comprised of a pair of beveled members.

Figure 11D:
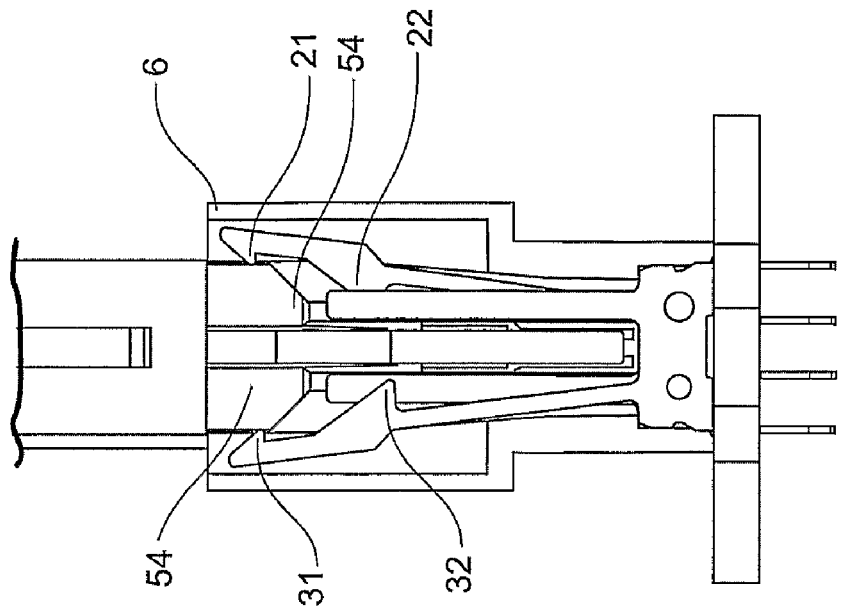
FIGS. 11C and 11D are end views showing the use of the tool illustrated in FIG. 10 with the connector and retention device of the present invention.
Figure 11C:
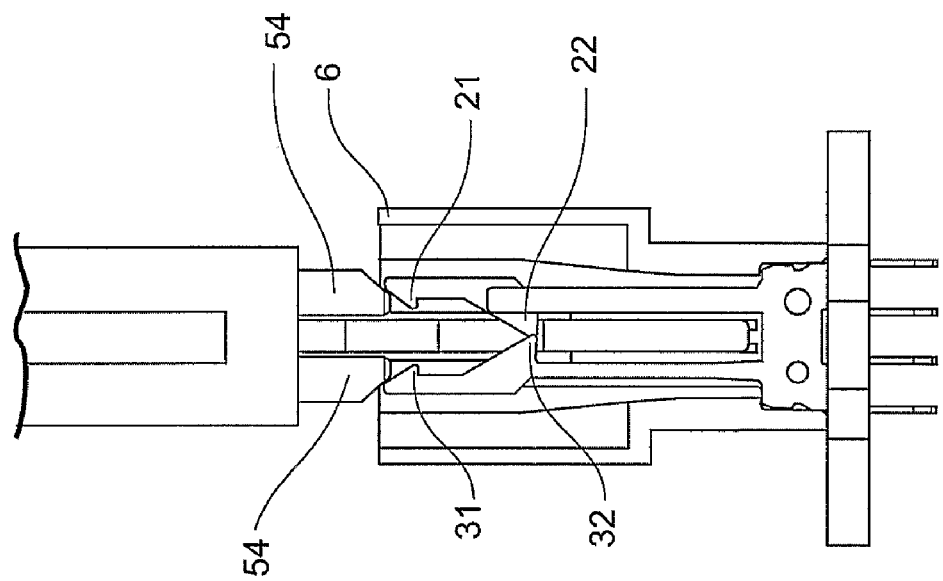

As seen in FIGS. 11B, 11C and 11D the beveled members align with the bevel of the disengaging members 21, 31, and as the head descends the disengaging members 21, 31 pushes the second legs of each spring out thus disengaging the hooks 32, 22 from the notch in the daughter card 2. Any device that pushes all 4 disengaging members at once would be suitable; the tool 50 illustrated in FIG. 10 is only one example of a suitable device.

The present invention is preferably used with daughter cards having a suitable notch 7, 8. While the daughter card 2 would still be able to be engage properly there would be no means for the latching mechanism to secure the daughter card in place.

The foregoing describes the invention with reference to the disclosed embodiment. Alterations and modifications as will be obvious to those skilled in the art are intended to be incorporated within the scope of the invention as defined in the accompanying claims.

What is claimed is:

1. An electrical connector for receiving a daughter card having a plurality of conductive surfaces, said electrical connector having:

a socket with an elongated slot for receiving said daughter card, said elongated slot having electrical terminals for engaging said plurality of conductive surfaces on said daughter card and for electrically connecting said daughter card to said connector; and a latch at each end of said elongated slot for securing said daughter card to said connector, each said latch including a pair of inwardly directed opposing securing hooks and a pair of unlocking members wherein each said latch comprises a mirrored pair of U shaped springs, each of said mirrored pair of U shaped springs having first and second coplanar legs, said second leg including one of said pair of inwardly directed opposing securing hooks and one of said pair of unlocking members.

2. An electrical connector as claimed in claim 1 wherein said securing hooks overlap in a first securing position.

3. An electrical connector as claimed in claim 2 wherein said overlap is in a scissor like manner.

4. An electrical connector as claimed in claim 2 wherein pushing apart said unlocking members moves said securing hooks from a first securing position to a second position, said second position not providing a securing force.

5. An electrical connector as claimed in claim 1 wherein each said latch is protected from accidental release by a protective cover.

6. An electrical connector as claimed in claim 5 wherein said protective cover and said socket are molded in one piece.

7. An electrical connector as claimed in claim 1 wherein each said spring is made of metal.

8. An electrical connector as claimed in claim 1 wherein each said spring is made of plastic.

9. An electrical connector as claimed in claim 1 wherein the ends of said daughter card include at least one notch and said pair of inwardly directed opposing securing hooks engage said notch to secure said daughter card within said socket.

10. An electrical connector as claimed in claim 1, wherein said latch includes a base, said securing hooks being located between said base and said unlocking members.

11. An electrical connector as claimed in claim 1, wherein each spring includes a base, said securing hook being located between said base and said unlocking member.

12. An electrical connector as claimed in claim 1 wherein each unlocking member is inwardly directed.

13. An electrical connector as claimed in claim 1 wherein each unlocking member is located at the distal end of the latch.

* * * * *